(12) United States Patent
Kim et al.

(10) Patent No.: US 12,261,174 B2
(45) Date of Patent: Mar. 25, 2025

(54) TRANSISTOR ELEMENT, TERNARY INVERTER APPARATUS COMPRISING SAME, AND METHOD FOR PRODUCING SAME

(71) Applicant: UNIST(ULSAN NATIONAL INSTITUTE OF SCIENCE AND TECHNOLOGY), Ulsan (KR)

(72) Inventors: Kyung Rok Kim, Ulsan (KR); Jae Won Jeong, Seoul (KR); Young Eun Choi, Ulsan (KR); Woo Seok Kim, Daegu (KR)

(73) Assignee: UNIST(ULSAN NATIONAL INSTITUTE OF SCIENCE AND TECHNOLOGY) (KR)

( * ) Notice: Subject to any disclaimer, the term of this patent is extended or adjusted under 35 U.S.C. 154(b) by 568 days.

(21) Appl. No.: 17/419,692

(22) PCT Filed: Dec. 16, 2019

(86) PCT No.: PCT/KR2019/017784
§ 371 (c)(1),
(2) Date: Jun. 29, 2021

(87) PCT Pub. No.: WO2020/141757
PCT Pub. Date: Jul. 9, 2020

(65) Prior Publication Data
US 2022/0085017 A1     Mar. 17, 2022

(30) Foreign Application Priority Data

Dec. 31, 2018   (KR) ........................ 10-2018-0174230
Jul. 5, 2019    (KR) ........................ 10-2019-0081518

(51) Int. Cl.
*H01L 27/092*     (2006.01)
*H01L 29/66*      (2006.01)
(Continued)

(52) U.S. Cl.
CPC .... *H01L 27/0928* (2013.01); *H01L 29/66492* (2013.01); *H01L 29/78* (2013.01); *H01L 29/7833* (2013.01); *H03K 19/09425* (2013.01)

(58) Field of Classification Search
CPC ................................................ H01L 29/1083
See application file for complete search history.

(56) References Cited

U.S. PATENT DOCUMENTS 4,905,073 A * 2/1990 Chen ..................... H01L 23/485
                                                        257/757
10,141,400 B2   11/2018 Lee
(Continued)

FOREIGN PATENT DOCUMENTS

JP      3886716 B      2/2007
JP      6060718 B      1/2017
(Continued)

OTHER PUBLICATIONS

International Search Report and Written Opinion for PCT/KR2019/017784, mailed Apr. 17, 2020 (w/English ISR).
(Continued)

*Primary Examiner* — Tucker J Wright
(74) *Attorney, Agent, or Firm* — Klarquist Sparkman, LLP

(57) ABSTRACT

A transistor device includes a substrate, a source region provided on the substrate, a drain region spaced apart from the source region in a direction parallel to a top surface of the substrate, a pair of constant current generating patterns provided in the substrate to be adjacent to the source region and the drain region, respectively, a gate electrode provided on the substrate and between the source region and the drain region, and a gate insulating film interposed between the gate electrode and the substrate, wherein, the pair of constant current generating patterns generate a constant current between the drain region and the substrate, and the constant (Continued)

current is independent from a gate voltage applied to the gate electrode.

5 Claims, 15 Drawing Sheets

(51) Int. Cl.
*H01L 29/78* (2006.01)
*H03K 19/094* (2006.01)

(56) References Cited

U.S. PATENT DOCUMENTS

| | | | |
|---|---|---|---|
| 10,198,023 B2 | 2/2019 | Yoshino | |
| 2004/0238883 A1* | 12/2004 | Nishinohara | H01L 27/092 |
| | | | 257/E29.055 |
| 2006/0121681 A1* | 6/2006 | Nandakumar | H01L 21/823807 |
| | | | 257/E21.345 |
| 2008/0121985 A1* | 5/2008 | Chen | H01L 29/1083 |
| | | | 257/E29.255 |
| 2016/0190142 A1 | 6/2016 | Kim et al. | |

FOREIGN PATENT DOCUMENTS

| | | |
|---|---|---|
| KR | 19990073669 A | 10/1999 |
| KR | 20010016838 A | 3/2001 |
| KR | 20090011493 A | 2/2009 |
| KR | 20140145667 A | 12/2014 |
| KR | 20160088074 A | 7/2016 |
| KR | 20170082179 | 7/2017 |
| KR | 20180111690 | 10/2018 |

OTHER PUBLICATIONS

Notice of Allowance for Korean Patent Application No. 10-2019-0081518, mailed Dec. 16, 2020 (w/English translation).
Office Action for Korean Application No. 10-2019-0081518, mailed Jul. 13, 2020 (w/English translation).

* cited by examiner

TRANSISTOR ELEMENT, TERNARY INVERTER APPARATUS COMPRISING SAME, AND METHOD FOR PRODUCING SAME

CROSS REFERENCE TO RELATED APPLICATIONS

This is the U.S. National Stage of International Application No. PCT/KR2019/017784, filed Dec. 16, 2019, which in turn claims priority to Korean Patent Application No. 10-2018-0174230, filed Dec. 31, 2018, and Korean Patent Application No. 10-2019-0081518, filed Jul. 5, 2019, which applications are incorporated herein in their entireties.

TECHNICAL FIELD

The present disclosure relates to a transistor device, a ternary inverter device including the same, and a method of manufacturing the same.

BACKGROUND ART

In order to rapidly process a large amount of data, conventional binary logic-based digital systems have focused on increasing the bit density through the miniaturization of an CMOS device. However, with the recent integration to less than 30-nm, there was a limitation in increasing the bit density due to the increase in leakage current and power consumption due to the quantum tunneling effect. In order to overcome the limitation of the bit density, interest in a ternary logic device and a circuit, which are one of multi-valued logics, is rapidly increasing, and in particular, development of a standard ternary inverter (STI) as a basic unit for implementing a ternary logic has been actively carried out. However, unlike conventional binary inverters using two CMOS's with a single voltage source, there is an issue that the conventional techniques regarding STI require more voltage sources or a complicated circuit configuration.

DESCRIPTION OF EMBODIMENTS

Technical Problem

An object to be solved is to provide a transistor device having a constant current independent from a gate voltage.

An object to be solved is to provide a ternary inverter device having a constant current independent from an input voltage.

An object to be solved is to provide a method of manufacturing a transistor device having a constant current independent from a gate voltage.

However, the objects to be solved are not limited to those disclosed above.

Solution to Problem

According to an aspect, a transistor device including: a substrate; a source region provided on the substrate; a drain region spaced apart from the source region in a direction parallel to a top surface of the substrate; a pair of constant current generating patterns provided in the substrate to be adjacent to the source region and the drain region, respectively; a gate electrode provided on the substrate and between the source region and the drain region; and a gate insulating film interposed between the gate electrode and the substrate, wherein the pair of constant current generating patterns generate a constant current between the drain region and the substrate, and the constant current is independent from a gate voltage applied to the gate electrode, may be provided.

Each of the pair of constant current generating patterns may be provided between a channel formed on the substrate and a bottom surface of the drain region.

The substrate and the pair of constant current generating patterns may have a first conductivity type, the source region and the drain region may have a second conductivity type that is different from the first conductivity type, and a doping concentration of each of the pair of constant current generating patterns may be greater than a doping concentration of the substrate.

The doping concentration of each of the pair of constant current generating patterns may be $3 \times 10^{18}$ cm$^{-3}$ or greater.

An electric field may be formed between the drain region and the constant current generating pattern provided immediately adjacent to a lower portion of the drain region, and an intensity of the electric field may be $10^6$ V/cm or greater.

The substrate and the source region may have the same voltage.

According to an aspect, a ternary inverter device including: an NMOS transistor device; and a PMOS transistor device, wherein each of the NMOS transistor device and the PMOS transistor device includes: a well region; a source region and a drain region in the well region, the source region and the drain region being spaced apart from each other in a direction parallel to a top surface of the well region; and a pair of constant current generating patterns provided adjacent to the source region and the drain region in the well region, respectively, and the pair of constant current generating patterns generate a constant current between the drain region and a lower portion of the well region, and the drain region of the NMOS transistor device and the drain region of the PMOS transistor device are electrically connected to each other and have the same voltage, may be provided.

Each of the NMOS transistor device and the PMOS transistor device may further include: a gate electrode provided on the well region; and a gate insulating film interposed between the gate electrode and the top surface of the well region, and the constant current may be independent from a gate voltage applied to the gate electrode.

The source region of the NMOS transistor device may be electrically connected to the well region of the NMOS transistor device and have the same voltage as the well region of the NMOS transistor device, and the source region of the PMOS transistor device may be electrically connected to the well region of the PMOS transistor device, and have the same voltage as the well region of the PMOS transistor device.

The drain region of the NMOS transistor device and the drain region of the PMOS transistor device may have a first voltage when the NMOS transistor device has a channel current that is stronger than the constant current and the PMOS transistor device has the constant current that is stronger than a channel current, have a second voltage when the NMOS transistor device has the constant current that is stronger than the channel current and the PMOS transistor device has the channel current that is stronger than the constant current, and have a third voltage when each of the NMOS transistor device and the PMOS transistor device has the constant current that is stronger than the channel current, wherein the second voltage may be greater than the first voltage, and the third voltage may have a value between the first voltage and the second voltage.

In each of the NMOS transistor device and the PMOS transistor device, the well region and the pair of constant current generating patterns may have conductivity types identical to each other, and a doping concentration of each of the pair of constant current generating patterns may be greater than a doping concentration of the well region.

In each of the NMOS transistor device and the PMOS transistor device, the doping concentration of each of the pair of constant current generating patterns may be $3 \times 10^{18}$ cm$^{-3}$ or greater.

According to an aspect, a method of manufacturing a transistor device including: forming a pair of constant current generating patterns at an upper portion of a substrate; forming a gate structure on the substrate; and forming, at the upper portion of the substrate, a source region and a drain region that are adjacent to the pair of constant current forming patterns, respectively, wherein the gate structure includes a gate insulating film and a gate electrode that are sequentially stacked on the substrate, and a pair of spacers provided on side surfaces of the gate electrode, the pair of constant current generating patterns generate a constant current between the drain region and the substrate, the constant current is independent from a gate voltage applied to the gate electrode, and the substrate and the pair of constant current generating patterns have the same conductivity type, may be provided.

The forming of the pair of constant current generating patterns may include: forming a pair of halo-doped regions by implanting an impurity into the upper portion of the substrate; and heat-treating the substrate, and the impurity may be implanted between a channel and a bottom surface of the drain region.

A thermal budget in the heat-treating may be controlled to adjust a magnitude of the constant current.

Advantageous Effects of Disclosure

The present disclosure may provide a transistor device having a constant current independent from a gate voltage.

The present disclosure may provide a ternary inverter device having a constant current independent from an input voltage.

The present disclosure may provide a method of manufacturing a transistor device having a constant current independent from a gate voltage.

However, the effects are not limited to those disclosed above.

MODE OF DISCLOSURE

Figure 1:
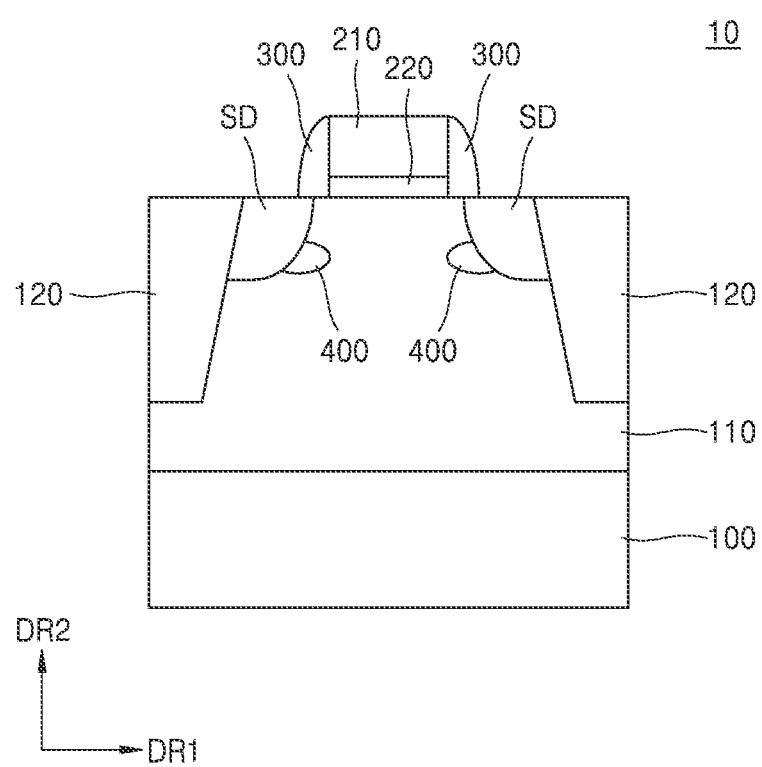
FIG. 1 is a diagram of a transistor device according to example embodiments.
Figure 2:
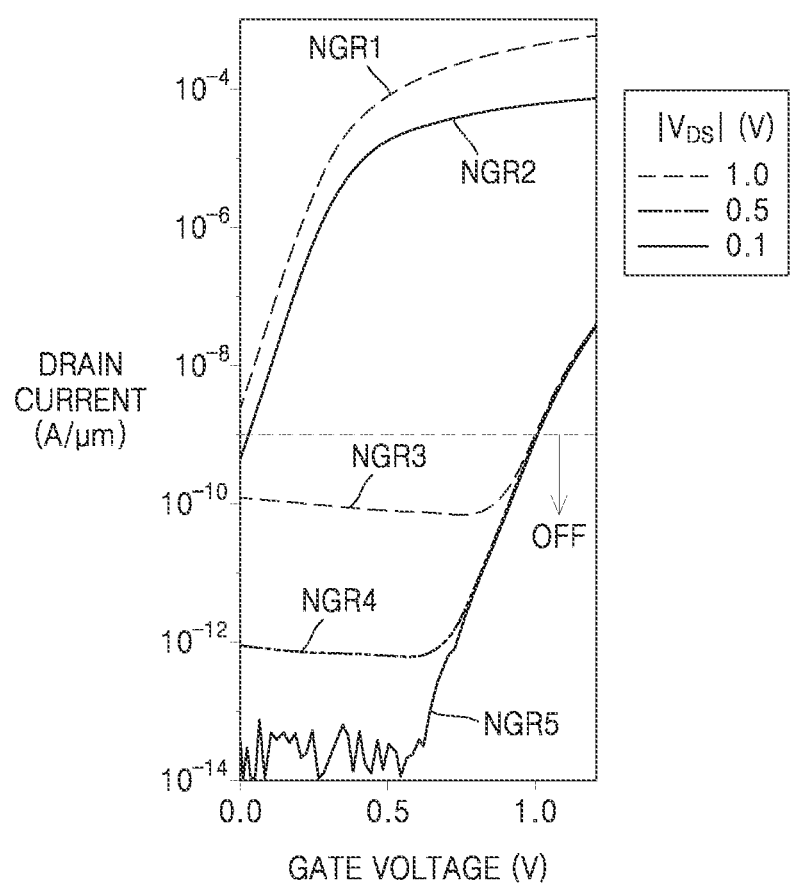
FIG. 2 shows gate voltage-drain current graphs of NMOS transistor devices of the present disclosure and conventional NMOS transistor devices.

Hereinafter, embodiments of the present disclosure will be described in detail with reference to the accompanying drawings. In the following drawings, like reference numerals refer to like elements, and sizes of elements in the drawings may be exaggerated for clarity and convenience of description. Meanwhile, the following embodiments are merely illustrative, and various modifications may be made from these embodiments.

Hereinafter, an expression "above" or "on" used herein may include not only "immediately on in a contact manner" but also "on in a non-contact manner".

An expression used in the singular encompasses the expression of the plural, unless it has a clearly different meaning in the context. In addition, when an element "includes" an element, unless there is a particular description contrary thereto, the element may further include other elements, not excluding the other elements.

Also, the terms described in the specification, such as " . . . er (or)", " . . . unit", etc., denote a unit that performs at least one function or operation, which may be implemented as hardware or software or a combination thereof.

FIG. 1 is a diagram of a transistor device according to example embodiments.

Referring to FIG. 1, a transistor device 10 may be provided. The transistor device 10 may include a substrate 100, a well region 110, a pair of device isolation regions 120, a pair of source/drain regions SD, a pair of constant current generating patterns 400, a gate electrode 210, a gate insulating film 220, and a pair of spacers 300.

The substrate 100 may be a semiconductor substrate. For example, the substrate 100 may be a silicon (Si) substrate, a germanium (Ge) substrate, or a silicon-germanium (SiGe) substrate. The substrate 100 may be an intrinsic semiconductor substrate.

The well region 110 may be provided in the substrate 100. The well region 110 may have a first conductivity type. For example, the first conductivity type may be n-type or p-type. In the case where the conductivity type of the well region 110 is n-type, the well region 110 may include a group V element (e.g., P, As) as an impurity. In the case where the conductivity type of the well region 110 is p-type, the well region 110 may include a group III element (e.g., B, In) as an impurity.

The pair of device isolation regions 120 spaced apart from each other in a first direction DR1 parallel to the top surface of the substrate 100 may be provided on the well region 110. The pair of device isolation regions 120 may extend in a second direction DR2 perpendicular to the top surface of the substrate 100. The pair of device isolation regions 120 may include an insulating material. For example, the pair of device isolation regions 120 may include silicon oxide (e.g., $SiO_2$).

The pair of source/drain regions SD spaced apart from each other in the first direction DR1 may be provided on the well region 110. One of the pair of source/drain regions SD may be a source of the transistor device. The other one of the pair of source/drain regions SD may be a drain of the transistor device. The pair of source/drain regions SD may have a second conductivity type different from the first conductivity type. In the case where the first conductivity type is n-type, the second conductivity type may be p-type. In the case where the conductivity type of the pair of source/drain regions SD is p-type, the pair of source/drain regions SD may include a group III element (e.g., B, In) as an impurity. In the case where the first conductivity type is p-type, the second conductivity type may be n-type. In the case where the conductivity type of the pair of source/drain regions SD is n-type, the pair of source/drain regions SD may include a group V element (e.g., P, As) as an impurity.

The pair of constant current generating patterns 400 may be provided on the well region 110. The pair of constant current generating patterns 400 may be spaced apart from each other in the first direction DR1. The pair of constant current generating patterns 400 may be provided between the pair of source/drain regions SD. The pair of constant current generating patterns 400 may be electrically connected to the pair of source/drain regions SD, respectively. For example, the pair of constant current generating patterns 400 may directly contact lower portions of the pair of source/drain regions SD, respectively. The pair of constant current generating patterns 400 may overlap the lower portions of the pair of source/drain regions SD in the first direction DR1. The pair of constant current generating patterns 400 may be formed under a channel (not shown) of the transistor device 10. For example, the constant current generating patterns 400 may be provided between a bottom surface of the channel and bottom surfaces of the source/drain regions SD. The channel may be formed between the pair of constant current generating patterns 400 and the top surface of the substrate 100 when the transistor device 10 has an on state.

The pair of constant current generating patterns 400 may have the first conductivity type. In the case where the conductivity type of the pair of constant current generating patterns 400 is n-type, the pair of constant current generating patterns 400 may include a group V element (e.g., P, As) as an impurity. In the case where the conductivity type of the pair of constant current generating patterns 400 is p-type, the pair of constant current generating patterns 400 may include a group III element (e.g., B, In) as an impurity. The doping concentration of each of the pair of constant current generating patterns 400 may be greater than the doping concentration of the well region 110. The doping concentration of each of the pair of constant current generating patterns 400 may be less than the doping concentration of each of the pair of source/drain regions SD. For example, the doping concentration of each of the pair of constant current generating patterns 400 may be $3 \times 10^{18}$ cm$^{-3}$ or greater. An electric field may be formed between the constant current generating pattern 400 and the source/drain region SD that are immediately adjacent to each other. For example, the intensity of the electric field may be $10^6$ V/cm or greater.

By the pair of constant current generating patterns 400, a constant current may be generated between the source/drain region SD, which is the drain of the transistor device, among the pair of source/drain regions SD, and the well region 110. The constant current may be a band-to-band tunneling (BTBT) current flowing between the source/drain region SD, which is the drain, and the constant current generating pattern 400 immediately adjacent thereto. The constant current may be independent from a gate voltage applied to the gate electrode 210. That is, the constant current may flow regardless of the gate voltage. In the case where the transistor device 10 is an NMOS transistor device, the constant current may flow from the source/drain region SD, which is the drain, to the well region 110 via the constant current generating pattern 400 immediately adjacent thereto. In the case where the transistor device 10 is a PMOS transistor device, the constant current may flow from the well region 110 to the source/drain region SD, which is the drain, via the constant current generating patterns 400 immediately adjacent thereto.

The gate electrode 210 may be provided above the well region 110. The gate electrode 210 may include an electrically conductive material. For example, the gate electrode may include a metal (e.g., Cu) or doped polysilicon (doped-poly Si).

The gate insulating film 220 may be provided between the gate electrode 210 and the top surface of the substrate 100. The gate insulating film 220 may electrically insulate the gate electrode 210 and the well region 110 from each other. The gate insulating film 220 may separate the gate electrode 210 and the substrate 100 from each other. The gate insulating film 220 may include an electrically insulating material. For example, the gate insulating film 220 may include $SiO_2$ or a high-k dielectric material (e.g., SiON, $HfO_2$, $ZrO_2$).

The pair of spacers 300 may be provided on both sidewalls of the gate electrode 210, respectively. The pair of spacers 300 may extend onto both sidewalls of the gate insulating film 220, respectively. The pair of spacers 300 may include an electrically insulating material. For example, the pair of spacers 300 may include $SiO_2$ or a high-k dielectric material (e.g., SiON, $HfO_2$, $ZrO_2$).

In example embodiments, a pair of lightly doped regions (not shown) may be provided on the pair of source/drain regions SD in the well region 110. The pair of lightly doped regions may be arranged between the pair of source/drain regions SD and the pair of spacers 300 immediately adjacent thereto, respectively. The pair of lightly doped regions may extend in the first direction DR1 to contact the pair of device isolation regions 120, respectively. The pair of lightly doped regions may have the second conductivity type. The doping concentration of the pair of lightly doped regions may be lower than the doping concentration of the pair of source/drain regions SD. The pair of lightly doped regions may reduce the occurrence of a short-channel effect and a hot-carrier effect. Accordingly, the electrical characteristics of the transistor device 10 may be improved.

The present disclosure may provide the transistor device 10 in which a constant current flows between the source/drain region SD, which the drain, and the well region 110.

Figure 3:
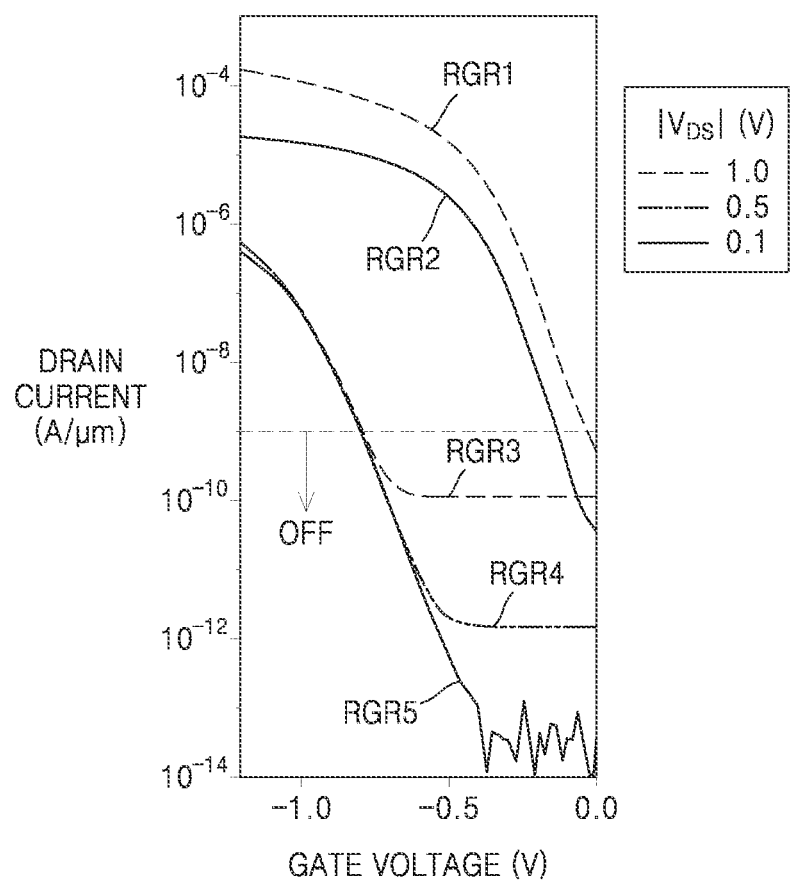
FIG. 3 shows gate voltage-drain current graphs of PMOS transistor devices of the present disclosure and conventional PMOS transistor devices.

FIG. 3 shows gate voltage-drain current graphs of PMOS transistor devices of the present disclosure and conventional PMOS transistor devices.

Referring to FIG. 3, gate voltage-drain current graphs RGR1 and RGR2 of the conventional PMOS transistor devices, and gate voltage-drain current graphs RGR3, RGR4, and RGR5 of the PMOS transistor devices according to the present disclosure are illustrated.

Drain currents of the conventional PMOS transistor devices did not have a constant current component flowing regardless of a gate voltage.

Drain currents of the PMOS transistor devices of the present disclosure had a constant current component flowing regardless of a gate voltage. For example, even when the PMOS transistor devices of the present disclosure had an off state, a constant current flowed through the PMOS transistor devices of the present disclosure.

Figure 4:
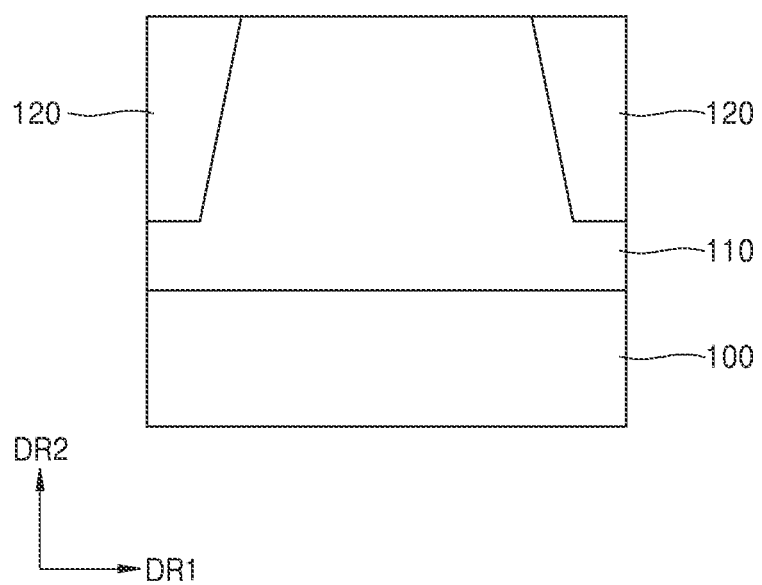
FIG. 4 is a diagram for describing a method of manufacturing the transistor device of FIG. 1.
Figure 5:
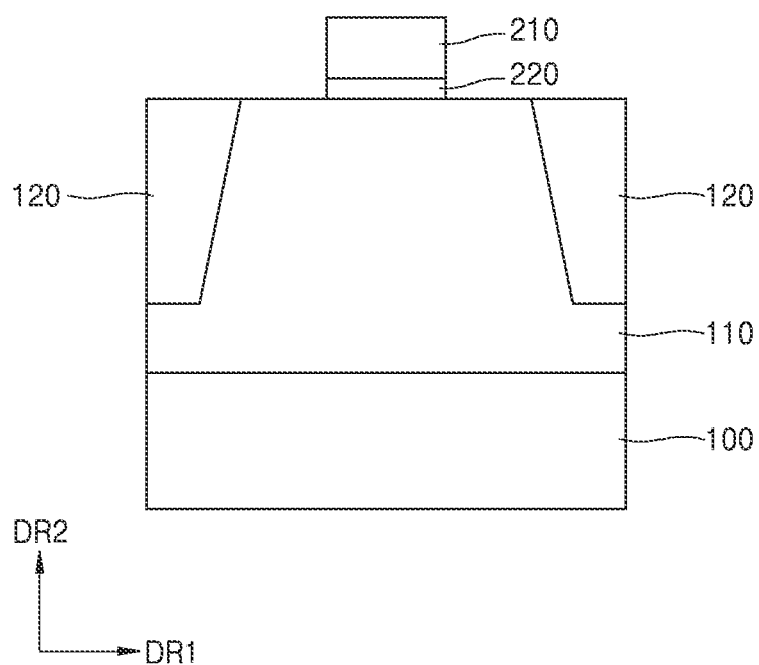
FIG. 5 is a diagram for describing a method of manufacturing the transistor device of FIG. 1.
Figure 6:
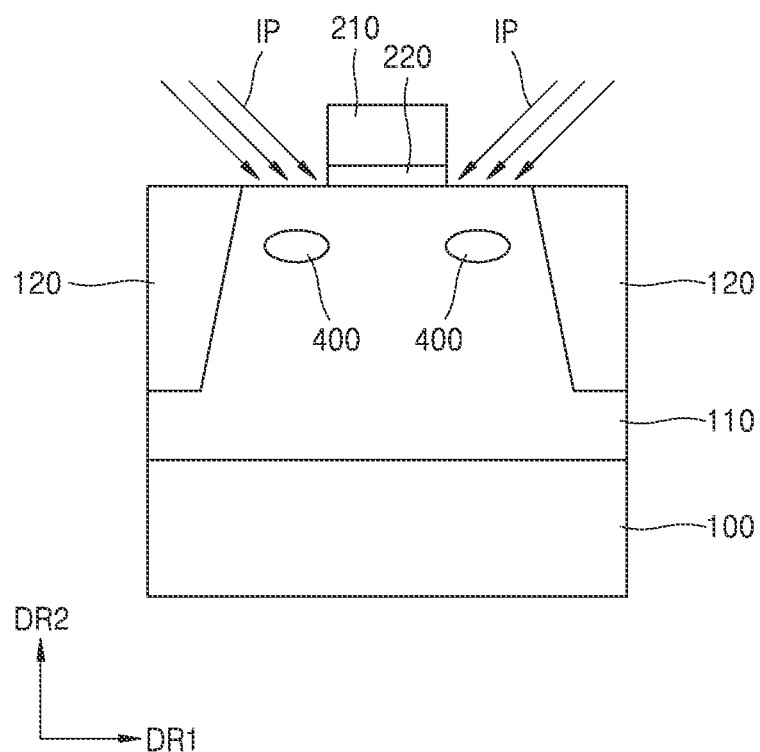
FIG. 6 is a diagram for describing a method of manufacturing the transistor device of FIG. 1.
Figure 7:
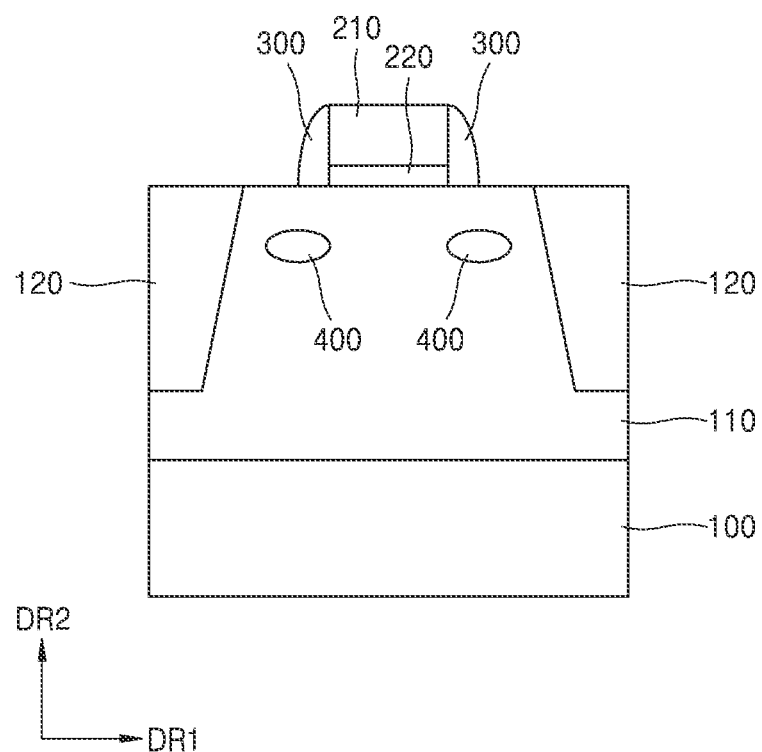
FIG. 7 is a diagram for describing a method of manufacturing the transistor device of FIG. 1.

FIG. 4 is a diagram for describing a method of manufacturing the transistor device of FIG. 1. FIG. 5 is a diagram for describing a method of manufacturing the transistor device of FIG. 1. FIG. 6 is a diagram for describing a method of manufacturing the transistor device of FIG. 1. FIG. 7 is a diagram for describing a method of manufacturing the transistor device of FIG. 1. For brevity of description, substantially the same descriptions as provided with reference to FIG. 1 may not be provided.

Referring to FIG. 4, the substrate 100 may be provided. The substrate 100 may be a semiconductor substrate. For example, the substrate 100 may be a silicon (Si) substrate, a germanium (Ge) substrate, or a silicon-germanium (SiGe) substrate. The substrate 100 may be an intrinsic semiconductor substrate.

The pair of device isolation regions 120 may be formed in the substrate 100. A process of forming the pair of device isolation regions 120 may include forming a pair of recess regions by recessing the substrate 100 to a certain depth, and filling the pair of recess regions with an electrically insulating material. For example, the pair of recess regions may be formed by performing an anisotropic etching process on the substrate 100. For example, the electrically insulating material may be provided to the pair of recess regions by a chemical vapor deposition process or a physical vapor deposition process.

The well region 110 may be formed between the pair of device isolation regions 120. The well region 110 may be formed by performing a process of doping the substrate 100 to a certain depth. For example, the doping process may include a diffusion process and/or an ion implantation process. In the case where an upper portion of the substrate 100 is doped with a group V element (e.g., P, As), the conductivity type of the well region 110 may be n-type. In the case where the upper portion of the substrate 100 is doped with a group III element (e.g., B, In), the conductivity type of the well region 110 may be p-type.

Referring to FIG. 5, the gate electrode 210 and the gate insulating film 220 may be formed above the substrate 100. Forming of the gate electrode 210 and the gate insulating film 220 may include performing a process of sequentially depositing an insulating material (e.g., $SiO_2$, SiON, $HfO_2$, $ZrO_2$) and a conductive material (e.g., a metal or doped polysilicon) on the substrate 100, and a process of patterning a deposited layer formed by the deposition process. For example, the deposition process may include a chemical vapor deposition process or a physical vapor deposition process. For example, the patterning process may include forming a mask pattern on the deposited layer, and performing an anisotropic etching process using the mask pattern on the deposited layer as an etch mask. The mask pattern may be removed during the anisotropic etching process or after the anisotropic etching process is completed. Referring to FIG. 6, the pair of constant current generating patterns 400 may be formed on the well region 110. For example, the pair of constant current generating patterns 400 may be formed to be deeper than the channel of the transistor device 10 (FIG. 1) described with reference to FIG. 1, but to be shallower than bottom surfaces of the pair of source/drain regions SD (FIG. 1). Forming of the pair of constant current generating patterns 400 may include performing an ion implantation (IP) process. For example, the pair of constant current generating patterns 400 may be a halo-doped region formed by the ion implantation (IP) process. The pair of constant current generating patterns 400 may have the same conductivity type as the well region 110. In the case where the conductivity type of the well region 110 is n-type, a group V element (e.g., P, As) may be further implanted into an upper portion of the well region 110 to form the pair of n-type constant current generating patterns 400. In the case where the conductivity type of the well region 110 is p-type, a group III element (e.g., B, In) may be further implanted into the upper portion of the well region 110 to form the pair of p-type constant current generating patterns 400.

After an impurity is implanted into the upper portion of the well region 110, the well region 110 may be heat-treated. A thermal budget of a heat treatment process may affect a threshold voltage characteristic and a constant current of the transistor device 10 (FIG. 1). For example, in the case where the thermal budget is greater than that required, the impurity implanted into the upper portion of the well region 110 may be diffused into the channel and thus change a threshold voltage. For example, in the case where the thermal budget is greater than that required, the doping concentration between the pair of source/drain regions SD and the pair of constant current generating patterns 400 may be gradually changed, and thus the magnitude of the constant current may be decreased. When performing the heat treatment process, the thermal budget may be adjusted such that the threshold voltage characteristic of the transistor device 10 (FIG. 1) is not changed or is minimally changed, and the transistor device 10 (FIG. 1) has a required constant current.

Referring to FIG. 7, the pair of spacers 300 may be formed on sidewalls of the gate electrode 210 and the gate insulating film 220, respectively. Forming of the pair of spacers 300 may include forming an insulating film on the substrate 100, the gate electrode 210, and the gate insulating film 220, and performing an anisotropic etching process on the insulating film. For example, the insulating film may be formed by conformally depositing an insulating material (e.g., $SiO_2$) on the substrate 100, the gate electrode 210, and the gate insulating film 220.

Referring again to FIG. 1, the pair of source/drain regions SD may be formed on the well region 110. Forming of the pair of source/drain regions SD may include performing a process of doping the well region 110 between the spacer 300 and the device isolation region 120 that are immediately adjacent to each other. For example, the doping process may include an ion implantation process. The pair of source/drain regions SD may be formed from the top surface of the substrate 100 to a certain depth. For example, the pair of source/drain regions SD may be formed from the top surface of the substrate 100 to a depth greater than the depth of the pair of constant current generating patterns 400. The pair of source/drain regions SD may have a conductivity type different from the conductivity type of the well region 110. In the case where the conductivity type of the well region 110 is n-type, a group III element (e.g., B, In) may be implanted into the well region 110 between the spacer 300 and the device isolation region 120, which are immediately adjacent to each other, to form the p-type source/drain region SD. In the case where the conductivity type of the well region 110 is p-type, a group V element (e.g., P, As) may be implanted into the well region 110 between the spacer 300 and the device isolation region 120, which are immediately adjacent to each other, to form the n-type source/drain region SD. The pair of source/drain regions SD may be formed such that the lower portions thereof overlap the pair of constant current generating patterns 400 in the first direction DR1. Accordingly, the transistor device 10 may be formed.

In example embodiments, the pair of lightly doped regions (not shown) may be formed on the pair of source/drain regions SD in the well region 110, respectively. The pair of lightly doped regions may be formed from the top surface of the substrate 100 to a certain depth, and the pair of source/drain regions SD may be formed from the certain depth to a depth greater than the depth of the pair of constant current generating patterns 400. The pair of lightly doped regions may be formed by a doping process. For example, the doping process may include an ion implantation process. The pair of lightly doped regions may have been doped to have the same conductivity type as the pair of source/drain regions SD.

Figure 8:
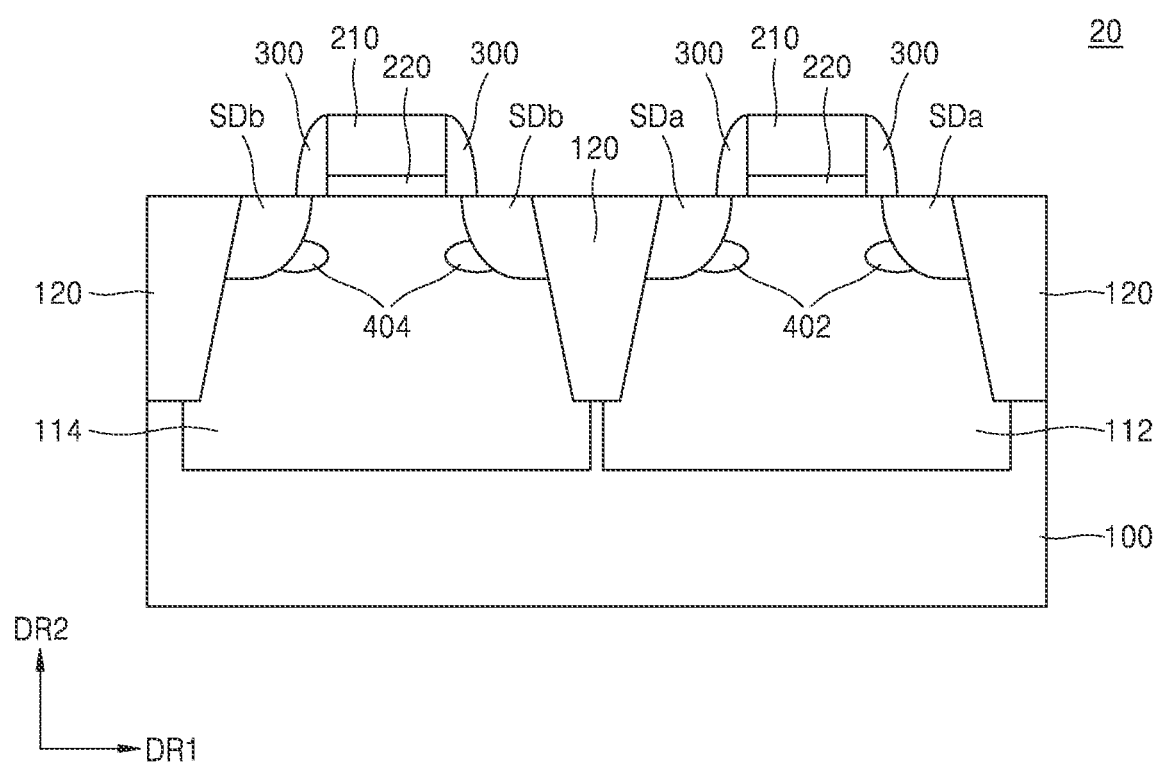
FIG. 8 is a diagram of a ternary inverter device according to example embodiments.
Figure 9:
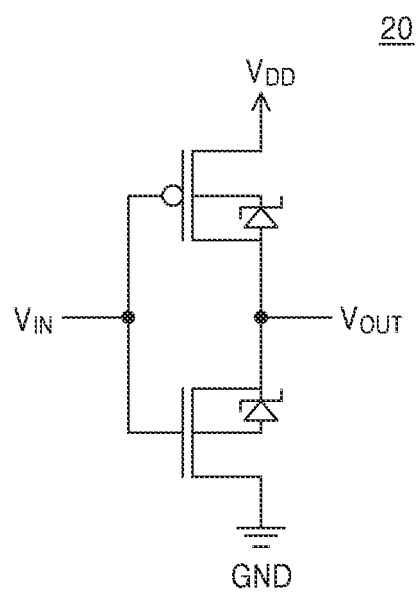
FIG. 9 is a circuit diagram of the ternary inverter device of FIG. 8.

FIG. 8 is a diagram of a ternary inverter device according to example embodiments. FIG. 9 is a circuit diagram of the ternary inverter device of FIG. 8. For brevity of description, substantially the same descriptions as provided with reference to FIG. 1 may not be provided.

Referring to FIG. 8, a ternary inverter device 20 may be provided. The ternary inverter device 20 may include the substrate 100, a first well region 112, the device isolation regions 120, a pair of first source/drain regions SDa, a pair of first constant current generating patterns 402, a second well region 114, a pair of second source/drain regions SDb, a pair of second constant current generating patterns 404, the gate electrodes 210, gate insulating films 220, and the spacers 300. The substrate 100 may be substantially the same as that described with reference to FIG. 1.

The device isolation regions 120 may be provided in the substrate 100. Each of the device isolation regions 120 may be substantially the same as each of the pair of device isolation regions 120 described with reference to FIG. 1. The device isolation regions 120 may be arranged in the first direction DR1 parallel to the top surface of the substrate 100. For example, the device isolation regions 120 may be arranged at substantially equal intervals.

The first well region 112 and the second well region 114 may be provided in the substrate 100. The first well region 112 may be spaced apart from the second well region 114 in the first direction DR1. Each of the first well region 112 and the second well region 114 may be provided between the device isolation regions 120 that are immediately adjacent to each other. The conductivity type of the first well region 112 may be n-type. The first well region 112 may include a group V element (e.g., P, As) as an impurity. The conductivity type of the second well region 114 may be p-type. The second well region 114 may include a group III element (e.g., B, In) as an impurity.

The pair of first source/drain regions SDa spaced apart from each other in the first direction DR1 may be provided on the first well region 112. The conductivity type of the pair of first source/drain regions SDa may be p-type. The pair of first source/drain regions SDa may include a group III element (e.g., B, In) as an impurity.

The pair of second source/drain regions SDb spaced apart from each other in the first direction DR1 may be provided on the second well region 114. The conductivity type of the pair of second source/drain regions SDb may be n-type. The pair of second source/drain regions SDb may include a group V element (e.g., P, As) as an impurity.

The pair of first constant current generating patterns 402 and the pair of second constant current generating patterns 404 may be provided in the first well region 112 and the second well region 114, respectively. The pair of first constant current generating patterns 402 may be provided between the pair of first source/drain regions SDa. For example, the pair of first constant current generating patterns 402 may overlap the first source/drain regions SDa in the first direction DR1. For example, the pair of first constant current generating patterns 402 may be provided between a bottom surface of a channel (not shown) that is formed between the first source/drain regions SDa, and bottom surfaces of the first source/drain regions SDa. The conductivity type of the pair of first constant current generating patterns 402 may be n-type. The pair of first constant current generating patterns 402 may include a group V element (e.g., P, As) as an impurity.

The pair of second constant current generating patterns 404 may be provided between the pair of second source/drain regions SDb. For example, the pair of second constant current generating patterns SDb may overlap the second source/drain regions SDb in the first direction DR1. For example, the pair of second constant current generating patterns 404 may be provided between a bottom surface of a channel that is formed between the second source/drain regions SDb, and bottom surfaces of the second source/drain regions SDb. The conductivity type of the pair of second constant current generating patterns 404 may be p-type. The pair of second constant current generating patterns 404 may include a group III element (e.g., B, In) as an impurity.

The gate electrodes 210 may be provided above the first well region 112 and the second well region 114, respectively. The gate insulating films 220 may be provided between the gate electrodes 210 and the top surface of the substrate 100, respectively. The spacers 300 may be provided on sidewalls of the gate electrodes 210, respectively.

The first well region 112, the pair of first source/drain regions SDa, the pair of first constant current generating patterns 402, the gate electrode 210, the gate insulating film 220, and the spacers 300 provided on both sidewalls of the gate electrode 210 may define a PMOS transistor device. The second well region 114, the pair of first source/drain regions SDa, the pair of second constant current generating patterns 404, the gate electrode 210, the gate insulating film 220, and the spacers 300 provided on both sidewalls of the gate electrode 210 may define an NMOS transistor device.

Referring to FIG. 9, a ground voltage may be applied to a source (one of the pair of second source/drain regions of FIG. 8) and a substrate (the second well region of FIG. 8) of the NMOS transistor device. For brevity of description, it is assumed that the ground voltage is 0 volt (V). A driving voltage $V_{DD}$ may be applied to a source (one of the pair of first source/drain regions of FIG. 8) and a substrate (the first well region of FIG. 8) of the PMOS transistor device. An input voltage Vin may be applied to each of a gate electrode (the gate electrode on the second well region of FIG. 8) of the NMOS transistor device and a gate electrode (the gate electrode on the first well region of FIG. 8) of the PMOS transistor device.

A drain (the other one of the pair of second source/drain regions of FIG. 8) of the NMOS transistor device may be electrically connected to a drain (the other one of the pair of first source/drain regions of FIG. 8) of the PMOS transistor device such that they respectively have identical voltages. The voltages of the drain of the NMOS transistor device and the drain of the PMOS transistor device may be an output voltage Vout of the ternary inverter device 20.

A constant current may flow from the drain to the substrate of the NMOS transistor device. A constant current may flow from the substrate to the drain of the PMOS transistor device. The constant currents may be independent from the input voltage Vin.

In one example, a first input voltage may be applied to the gate electrode of the PMOS transistor device and the gate electrode of the NMOS transistor device, such that the PMOS transistor device has a constant current that is stronger than a channel current and the NMOS transistor device has a channel current that is stronger than a constant current. In this case, the output voltage Vout of the ternary inverter device 20 may be a first voltage.

In another example, a second input voltage may be applied to the gate electrode of the PMOS transistor device and the gate electrode of the NMOS transistor device, such that the NMOS transistor device has a constant current that is stronger than a channel current and the PMOS transistor device has a channel current that is stronger than a constant current. In this case, the output voltage of the ternary inverter device 20 may be a second voltage greater than the first voltage.

In another example, a third input voltage may be applied to the gate electrode of the PMOS transistor device and the gate electrode of the NMOS transistor device, such that each of the NMOS transistor device and the PMOS transistor device has a constant current that is stronger than a channel current. In this case, the output voltage of the ternary inverter device 20 may be a third voltage between the first voltage and the second voltage.

The constant current flowing from the drain to the substrate of the NMOS transistor device and the constant current flowing from the substrate to the drain of the PMOS transistor device may flow regardless of the gate voltages applied to the gate electrodes of the PMOS transistor device and the NMOS transistor device. A current in the ternary inverter device 20 may flow from the substrate of the PMOS transistor device to the substrate of the NMOS transistor device via the drain of the PMOS transistor device and the drain of the NMOS transistor device. The driving voltage $V_{DD}$ may be divided by a resistance between the substrate of the PMOS transistor device and the drain of the PMOS transistor device, and a resistance between the substrate of the NMOS transistor device and the drain of the NMOS transistor device. The output voltage Vout may be a voltage to which the driving voltage $V_{DD}$ is dropped by the resistance between the substrate of the PMOS transistor device and the drain of the PMOS transistor device. Accordingly, the output voltage Vout may have a value between the driving voltage VDD and 0 V.

The output voltage Vout may have the first voltage (State '0'), the third voltage (State '1') greater than the first voltage, or the second voltage (State '2') greater than the third voltage, according to the input voltage Vin. The present disclosure may provide the ternary inverter device 20 having three states according to the input voltage Vin.

In example embodiments, the lightly doped regions (not shown) may be provided on the pair of first source/drain regions SDa and the pair of second source/drain regions SDb. For example, the lightly doped regions may be respectively arranged between the pair of first source/drain regions SDa and the spacers 300 immediately adjacent thereto, and between the pair of second source/drain regions SDb and the spacers 300 immediately adjacent thereto. Each of the lightly doped regions may extend in the first direction DR1 to contact the device isolation regions 120.

The conductivity type of the lightly doped regions on the pair of first source/drain regions SDa may be n-type. The doping concentration of the lightly doped regions on the pair of first source/drain regions SDa may be less than the doping concentration of the pair of first source/drain regions SDa.

The conductivity type of the lightly doped regions on the pair of second source/drain regions SDb may be p-type. The doping concentration of the lightly doped regions on the pair of second source/drain regions SDb may be less than the doping concentration of the pair of second source/drain regions SDb.

The lightly doped regions may reduce the occurrence of a short-channel effect and a hot-carrier effect. Accordingly, the electrical characteristics of the ternary inverter device 20 may be improved.

Figure 10:
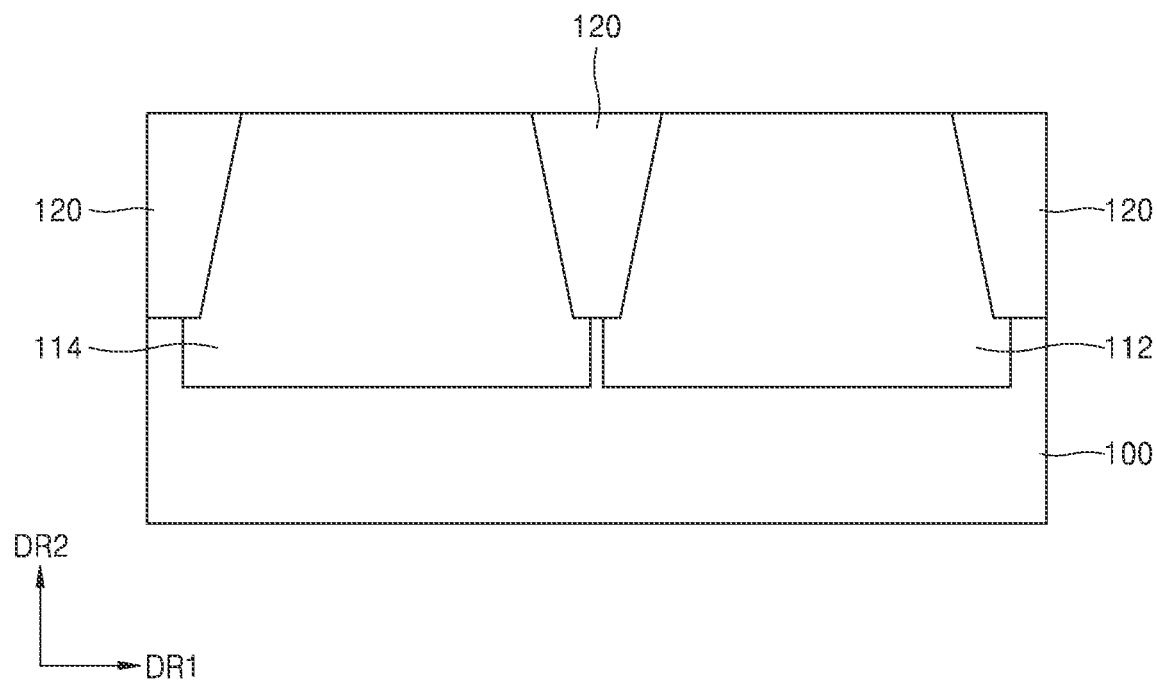
FIG. 10 is a diagram for describing a method of manufacturing the ternary inverter device of FIG. 8.
Figure 11:
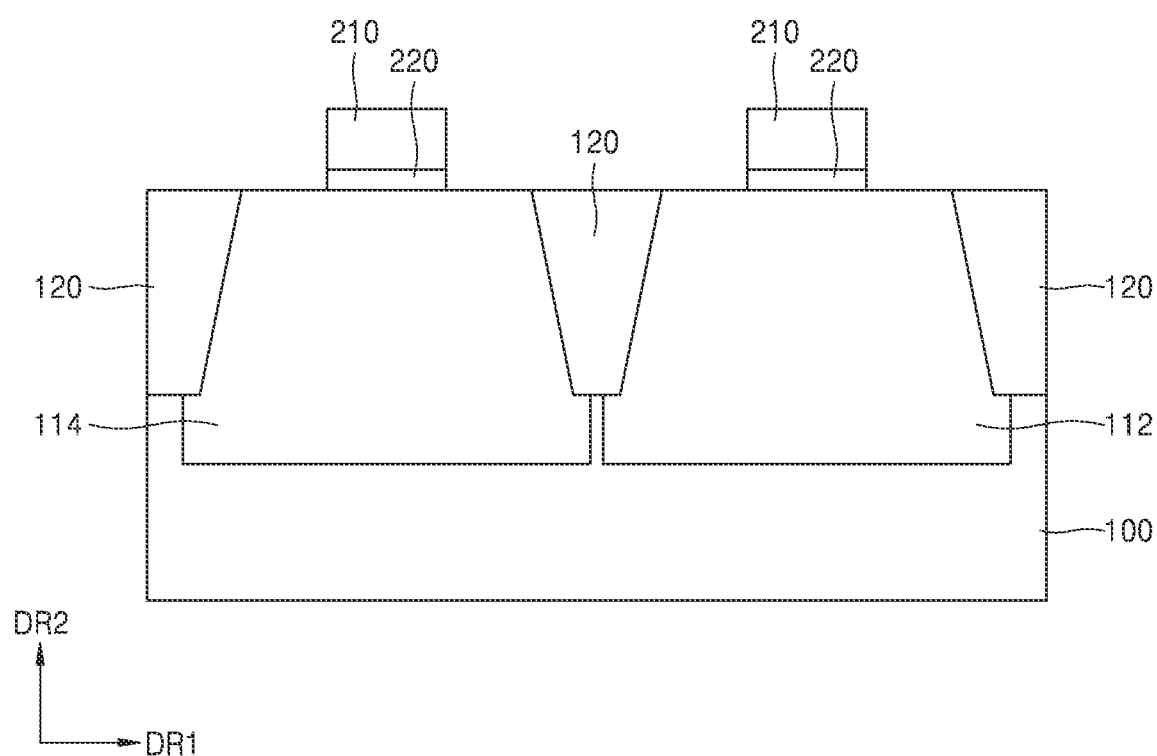
FIG. 11 is a diagram for describing a method of manufacturing the ternary inverter device of FIG. 8.
Figure 12:
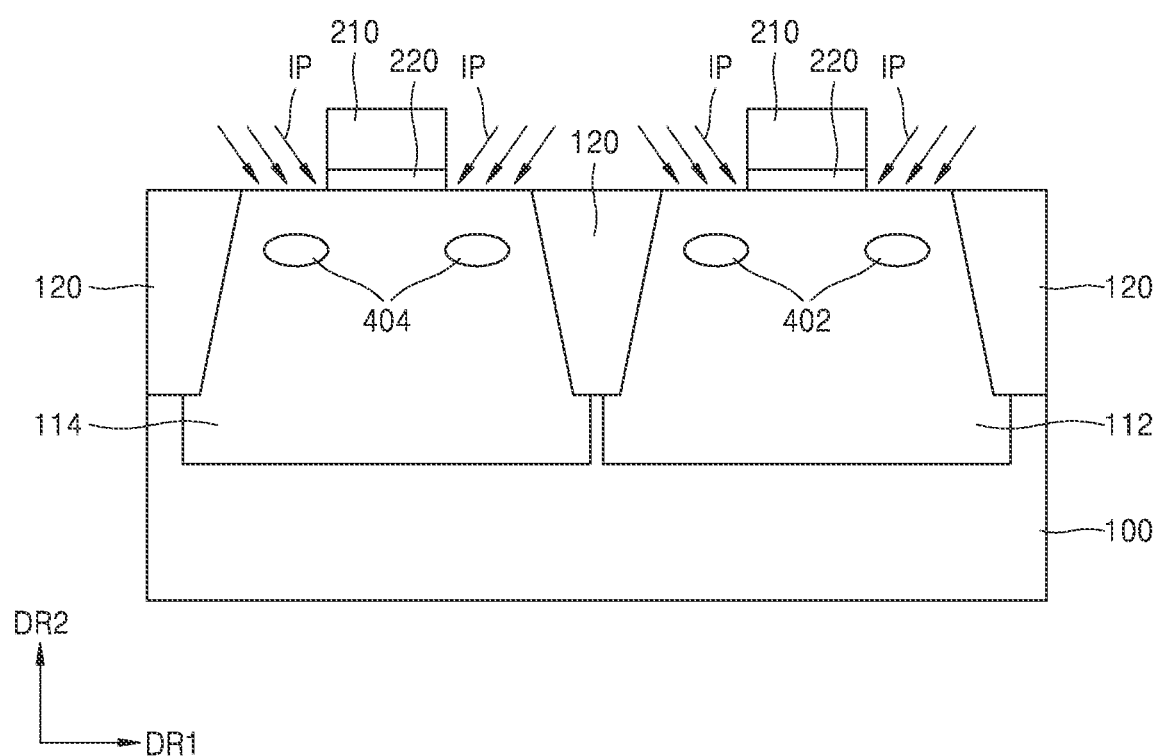
FIG. 12 is a diagram for describing a method of manufacturing the ternary inverter device of FIG. 8.
Figure 13:
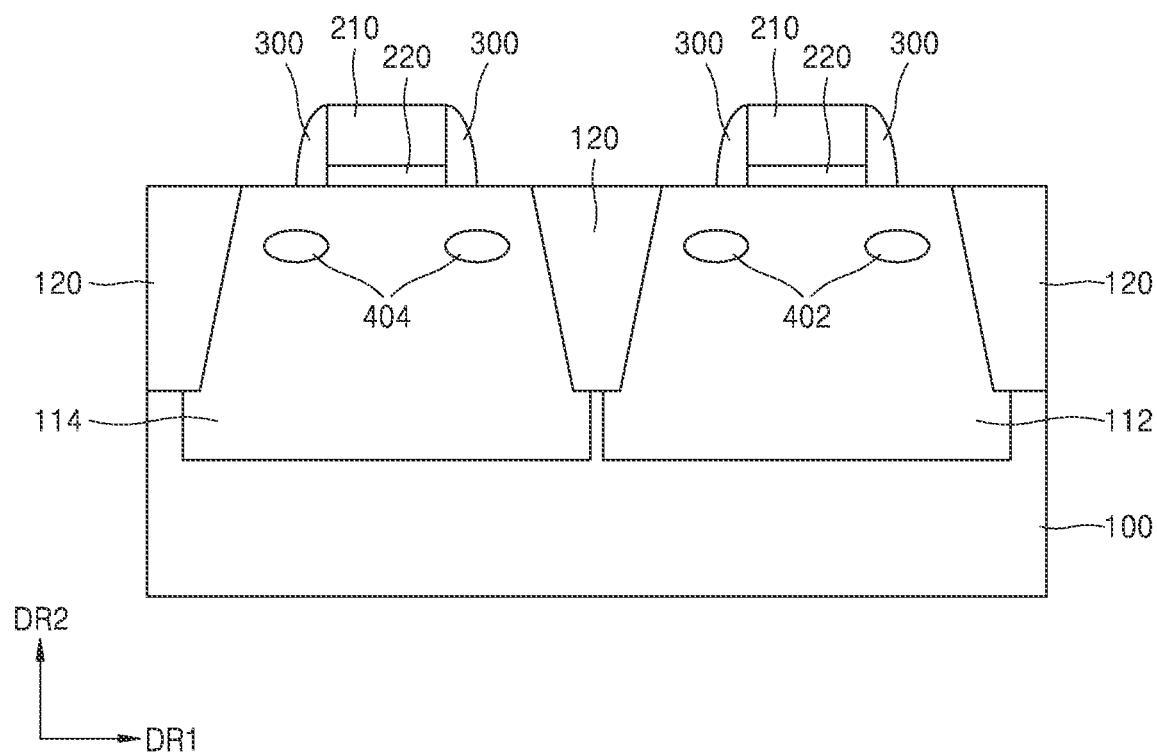
FIG. 13 is a diagram for describing a method of manufacturing the ternary inverter device of FIG. 8.

FIG. 10 is a diagram for describing a method of manufacturing the ternary inverter device of FIG. 8. FIG. 11 is a diagram for describing a method of manufacturing the ternary inverter device of FIG. 8. FIG. 12 is a diagram for describing a method of manufacturing the ternary inverter device of FIG. 8. FIG. 13 is a diagram for describing a method of manufacturing the ternary inverter device of FIG. 8. For brevity of description, substantially the same descriptions as provided with reference to FIGS. 4 to 7 and FIG. 8 may not be provided.

Referring to FIG. 10, the device isolation regions 120 may be formed in the substrate 100. A process of forming the device isolation regions 120 may be substantially the same as the process of forming the pair of device isolation regions 120 described with reference to FIG. 4.

The first well region 112 may be formed between a pair of device isolation regions 120 that are directly adjacent to each other, among the device isolation regions 120. The first well region 112 may be formed by a process of doping the substrate 100 with a group V element (e.g., P, As). The conductivity type of the first well region 112 may be n-type.

The second well region 114 may be formed between another pair of device isolation regions 120 that are directly adjacent to each other, among the device isolation regions 120. The second well region 114 may be formed by a process of doping the substrate 100 with a group III element (e.g., B, In). The conductivity type of the second well region 114 may be p-type.

Referring to FIG. 11, the gate electrode 210 and the gate insulating film 220 may be formed on each of the first well region 112 and the second well region 114. Forming of the gate electrode 210 and the gate insulation layer 220 may be substantially the same as that described with reference to FIG. 5.

Referring to FIG. 12, the pair of first constant current generating patterns 402 may be formed on the first well region 112. For example, the pair of first constant current generating patterns 402 may be provided between the bottom surface of the channel (not shown) that is formed between the first source/drain regions SDa (FIG. 8) as described above with reference to FIG. 8, and the bottom surfaces of the first source/drain regions SDa (FIG. 8). Forming of the pair of first constant current generating patterns 402 may include a process of implanting a group V element (e.g., P, As) into an upper portion of the first well region 112. For example, the pair of first constant current generating patterns 402 may be halo-doped regions formed by the ion implantation (IP) process. The conductivity type of the pair of first constant current generating patterns 402 may be n-type.

The pair of second constant current generating patterns 404 may be formed on the second well region 114. For example, the pair of second constant current generating patterns 404 may be provided between the bottom surface of the channel (not shown) that is formed between the second source/drain regions SDb (FIG. 8) as described above with reference to FIG. 8, and the bottom surfaces of the second source/drain regions SDb (FIG. 8). Forming of the pair of second constant current generating patterns 404 may include a process of implanting a group III element (e.g., B, In) into an upper portion of the second well region 114. For example, the pair of second constant current generating patterns 404 may be halo-doped (IP) regions formed by an ion implantation process. The conductivity type of the pair of second constant current generating patterns 404 may be p-type.

After impurities are implanted into the first and second well regions 112 and 114, the first and second well regions 112 and 114 may be heat-treated. A thermal budget of the heat treatment process may affect threshold voltage characteristics and constant currents of the transistor devices in the ternary inverter device 20 (FIG. 8). For example, in the case where the thermal budget is greater than that required, the impurities implanted into the upper portions of the first and second well regions 112 and 114 may be diffused into the channels and thus change threshold voltages. For example, in the case where the thermal budget is greater than that required, the doping concentration between the pair of first source/drain regions SDa and the pair of first constant current generating patterns 402 and between the pair of second source/drain regions SDb and the second constant current generating patterns 404 may be gradually changed, and thus the magnitude of the constant currents may be decreased. When performing the heat treatment process, the thermal budget may be adjusted such that the threshold voltage characteristic of the ternary inverter device 20 (FIG. 8) is not changed or is minimally changed, and the ternary inverter device 20 (FIG. 8) has a required constant current.

Referring to FIG. 13, the pair of spacers 300 may be formed. Forming of the pair of spacers 300 may be substantially the same as that described with reference to FIG. 7.

Referring again to FIG. 8, the pair of first source/drain regions SDa may be formed on the first well region 112. Forming of each of the pair of first source/drain regions SDa may include a process of implanting a group III element (e.g., B, In) into the first well region 112 between the spacer 300 and the device isolation region 120 immediately adjacent to each other. The conductivity type of the first source/drain regions SDa may be p-type.

The pair of second source/drain regions SDb may be formed on the second well region 114. Forming of each of the pair of second source/drain regions SDb may include a process of implanting a group V element (e.g., P, As) into the second well region 114 between the spacer 300 and the device isolation region 120 that are directly adjacent to each other. The conductivity type of the second source/drain regions SDb may be n-type.

Accordingly, the ternary inverter device 20 may be provided.

In example embodiments, the lightly doped regions (not shown) may be formed on the pair of first source/drain regions SDa and the pair of second source/drain regions SDb, respectively. The lightly doped regions may be formed from the top surface of the substrate 100 to a certain depth, and the pair of first source/drain regions SDa and the pair of second source/drain regions SDb may be formed from the certain depth to a depth greater than the depth of the pair of first constant current generating patterns 402 and the pair of second constant current generating patterns 404. The lightly doped regions may be formed by a doping process. For example, the doping process may include an ion implantation process. The conductivity type of the lightly doped regions on the pair of first source/drain regions SDa may be the same as that of the pair of first source/drain regions SDa. The conductivity type of the lightly doped regions on the pair of second source/drain regions SDb may be the same as that of the pair of second source/drain regions SDb.

Figure 14:
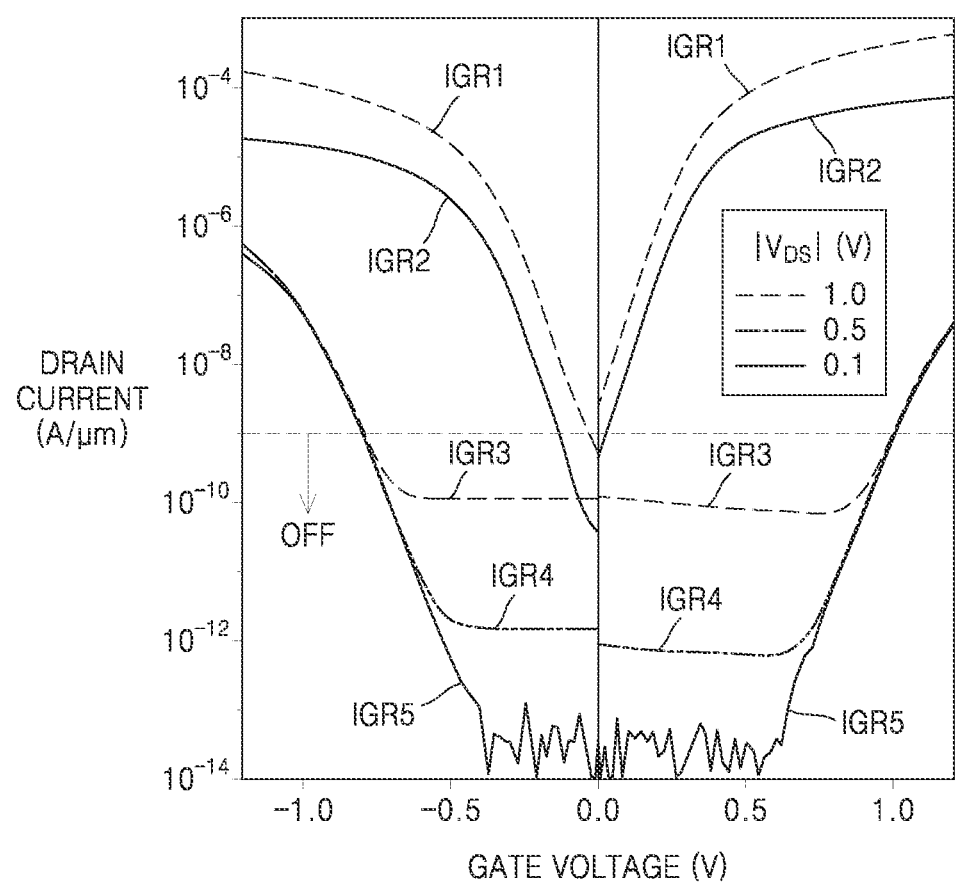
FIG. 14 shows gate voltage-drain current graphs of ternary inverter devices of the present disclosure and binary inverter devices.

FIG. 14 shows gate voltage-drain current graphs of ternary inverter devices of the present disclosure and binary inverter devices.

Referring to FIG. 14, gate voltage-drain current graphs IGR1 and IGR2 of the binary inverter devices and gate voltage-drain current graphs IGR3, IGR4, and IGR5 of the ternary inverter devices of the present disclosure are illustrated.

Drain currents of the binary inverter devices did not have a constant current component flowing regardless of a gate voltage.

Drain currents of the ternary inverter devices of the present disclosure had a constant current component flowing regardless of a gate voltage. For example, even when the ternary inverter devices of the present disclosure had an off state, a constant current flowed through the ternary inverter devices of the present disclosure.

Figure 15:
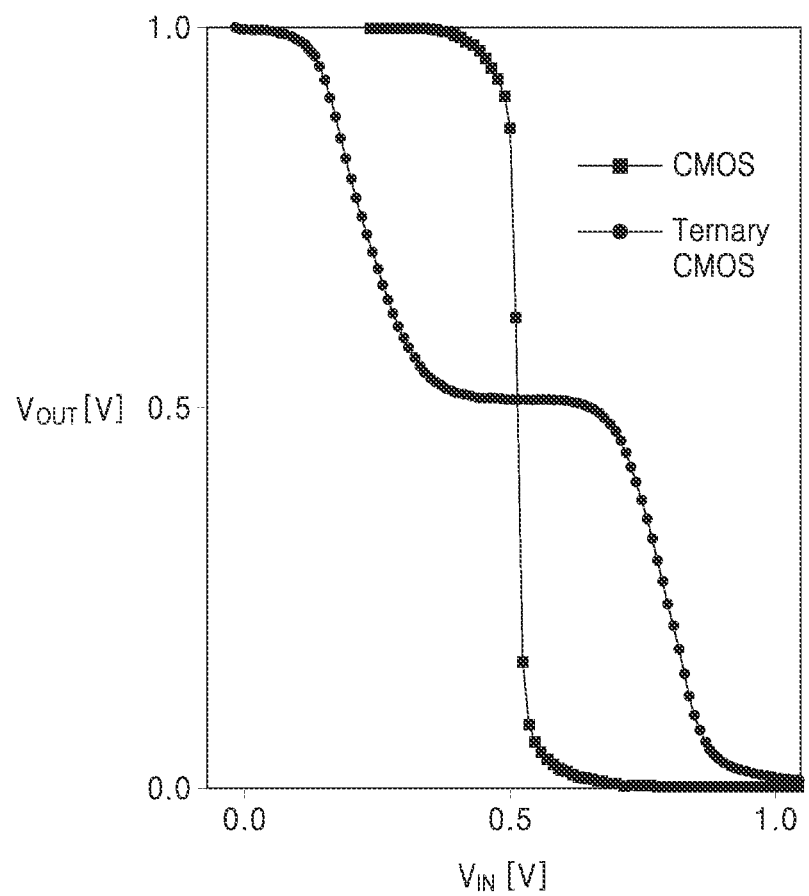
FIG. 15 shows an input voltage Vin-output voltage Vout graph of the ternary inverter device of the present disclosure and a binary inverter device.

FIG. 15 shows an input voltage Vin-output voltage Vout graph of the ternary inverter device of the present disclosure and a binary inverter device.

Referring to FIG. 15, the driving voltages $V_{DD}$ of the ternary inverter device 20 and the binary inverter device were 1.0 V, and a ground voltage GND was 0 V. The input voltages Vin of the ternary inverter device 20 and the binary inverter device were 0 V to 1.0 V.

In the case of the binary inverter device, when the input voltage was changed from 0 V to 1 V, the output voltage Vout rapidly decreased from 1 V to 0 V in the vicinity of an input voltage of 0.5 V. That is, the binary inverter device has two states (e.g., State '0' and State '1').

In the case of the ternary inverter device of the present disclosure, when the input voltage was changed from 0 V to 1 V, the output voltage Vout rapidly decreased from 1 V to 0.5 V, then plateaued at 0.5 V, and then rapidly decreased from 0.5 V to 0 V once more. That is, the ternary inverter device of the present disclosure has three states (e.g., State '0', State '1', and State '2').

The above description of the embodiments of the spirit of the present disclosure provides examples for the description of the spirit of the present disclosure. Therefore, the spirit of the present disclosure is not limited to the above embodiments, and it is apparent that various modifications and changes may be made by one of ordinary skill in the art, within the spirit of the present disclosure, for example, by combining the above embodiments.

The invention claimed is:

1. A ternary inverter device comprising:
   an NMOS transistor device; and
   a PMOS transistor device,
   wherein each of the NMOS transistor device and the PMOS transistor device comprises:
      a well region;
      a source region, a drain region and a channel region in the well region, the source region and the drain region are spaced apart from each other in a direction parallel to a top surface of the well region, the channel region is between the source region and the drain region; and a pair of constant current generating patterns provided adjacent to the source region and the drain region in the well region, respectively, each of the pair of constant current generating patterns extends below a channel region between the source region and the drain region and is spaced apart from the other, and the pair of constant current generating patterns generate a constant current between the drain region and a lower portion of the well region, and the drain region of the NMOS transistor device and the drain region of the PMOS transistor device are electrically connected to each other and have a same voltage, wherein the drain region of the NMOS transistor device and the drain region of the PMOS transistor device have:
- a first voltage when the NMOS transistor device has a channel current that is stronger than the constant current and the PMOS transistor device has the constant current that is stronger than its channel current,
- a second voltage when the NMOS transistor device has the constant current that is stronger than the channel current and the PMOS transistor device has its channel current that is stronger than the constant current, and
- a third voltage when each of the NMOS transistor device and the PMOS transistor device has the constant current that is stronger than each respective channel current, wherein the second voltage is greater than the first voltage, and the third voltage has a value between the first voltage and the second voltage.

2. The ternary inverter device of claim 1, wherein each of the NMOS transistor device and the PMOS transistor device further comprises:
- a gate electrode provided on the well region; and
- a gate insulating film interposed between the gate electrode and the top surface of the well region, and
- the constant current is independent from a gate voltage applied to the gate electrode.

3. The ternary inverter device of claim 2, wherein
the source region of the NMOS transistor device is electrically connected to the well region of the NMOS transistor device and has a same voltage as the well region of the NMOS transistor device, and
the source region of the PMOS transistor device is electrically connected to the well region of the PMOS transistor device, and a same voltage as the well region of the PMOS transistor device.

4. The ternary inverter device of claim 1, wherein, in each of the NMOS transistor device and the PMOS transistor device, the well region and the pair of constant current generating patterns have conductivity types identical to each other, and a doping concentration of each of the pair of constant current generating patterns is greater than a doping concentration of the well region.

5. The ternary inverter device of claim 4, wherein, in each of the NMOS transistor device and the PMOS transistor device, the doping concentration of each of the pair of constant current generating patterns is $3 \times 10^{18}$ cm$^{-3}$ or greater.

* * * * *